US012698569B2

(12) United States Patent
Igarashi et al.

(10) Patent No.: US 12,698,569 B2
(45) Date of Patent: Aug. 4, 2026

(54) SINGLE CRYSTAL GROWTH APPARATUS

(71) Applicant: Novel Crystal Technology, Inc., Saitama (JP)

(72) Inventors: Takuya Igarashi, Saitama (JP); Yuki Ueda, Saitama (JP); Kimiyoshi Koshi, Saitama (JP)

(73) Assignee: Novel Crystal Technology, Inc., Saitama (JP)

( * ) Notice: Subject to any disclaimer, the term of this patent is extended or adjusted under 35 U.S.C. 154(b) by 227 days.

(21) Appl. No.: 18/049,309

(22) Filed: Oct. 25, 2022

(65) Prior Publication Data

US 2023/0130166 A1     Apr. 27, 2023

(30) Foreign Application Priority Data

Oct. 26, 2021     (JP) .................................. 2021-174626

(51) Int. Cl.
| | |
|---|---|
| *C30B 11/00* | (2006.01) |
| *C30B 29/16* | (2006.01) |
| *C30B 35/00* | (2006.01) |

(52) U.S. Cl.
CPC .......... *C30B 11/002* (2013.01); *C30B 11/003* (2013.01); *C30B 29/16* (2013.01); *C30B 35/002* (2013.01); *Y10T 117/10* (2015.01)

(58) Field of Classification Search
CPC ... C30B 11/002; C30B 11/003; C30B 11/007; C30B 11/02; C30B 29/16; C30B 35/00; C30B 35/002
See application file for complete search history.

(56) References Cited

U.S. PATENT DOCUMENTS

| | | |
|---|---|---|
| 10,907,271 B2 | 2/2021 | Schroeck |
| 11,028,501 B2 | 6/2021 | Galazka et al. |
| (Continued) | | |

FOREIGN PATENT DOCUMENTS

| | | |
|---|---|---|
| CN | 105297130 A | 2/2016 |
| CN | 106381525 A | 2/2017 |
| (Continued) | | |

OTHER PUBLICATIONS

Official Action dated Nov. 20, 2023 received from the Korean Patent Office in related KR 10-2022-0137928 together with English language translation.

(Continued)

*Primary Examiner* — Hua Qi
(74) *Attorney, Agent, or Firm* — Scully, Scott, Murphy & Presser, P.C.

(57) ABSTRACT
A single crystal growth apparatus to grow a single crystal of a gallium oxide-based semiconductor. The apparatus includes a crucible that includes a seed crystal section to accommodate a seed crystal, and a growing crystal section which is located on the upper side of the seed crystal section and in which the single crystal is grown by crystallizing a raw material melt accommodated therein, a tubular susceptor surrounding the seed crystal section and also supporting the crucible from below, and a molybdenum disilicide heating element to melt a raw material in the growing crystal section to obtain the raw material melt. The susceptor includes a thick portion at a portion in a height direction that is thicker and has a shorter horizontal distance from the seed crystal section than other portions. The thick portion surrounds at least a portion of the seed crystal section in the height direction.

4 Claims, 9 Drawing Sheets

(56)    References Cited

U.S. PATENT DOCUMENTS

| | | | |
|---|---|---|---|
| 11,674,239 B2 | 6/2023 | Hoshikawa et al. | |
| 2006/0174822 A1* | 8/2006 | Sumiya .................. | C30B 29/12 |
| | | | 117/83 |
| 2009/0013925 A1 | 1/2009 | Servant et al. | |
| 2017/0362738 A1 | 12/2017 | Galazka et al. | |
| 2020/0141025 A1 | 5/2020 | Schroeck | |
| 2021/0269941 A1* | 9/2021 | Hoshikawa .......... | C30B 35/002 |

FOREIGN PATENT DOCUMENTS

| | | | |
|---|---|---|---|
| CN | 113308728 A | | 8/2021 |
| JP | H04-187585 A | | 7/1992 |
| JP | 09286700 A | * | 11/1997 |
| JP | H1129398 A | | 2/1999 |
| JP | 2020164415 A | | 10/2020 |
| JP | 2021-134140 A | | 9/2021 |
| KR | 10-2019-0102253 A | | 9/2019 |
| KR | 10-2021-0109470 A | | 9/2021 |

OTHER PUBLICATIONS

Extended European Search Report dated Feb. 2, 2023 from related EP 22 20 3535.4.

Notice of Reasons for Refusal dated Jul. 1, 2025 received from the Japanese Patent Office in counterpart JP 2021-174626 together with English language translation.

Official Action dated Mar. 20, 2026 received from the China National Intellectual Property Administration in related application CN 202211305722.9 together with English language translation.

* cited by examiner

SINGLE CRYSTAL GROWTH APPARATUS

CROSS-REFERENCES TO RELATED APPLICATIONS

The present patent application claims the priority of Japanese patent application No. 2021/174626 filed on Oct. 26, 2021, and the entire contents of Japanese patent application No. 2021/174626 are hereby incorporated by reference.

TECHNICAL FIELD

The present invention relates to a single crystal growth apparatus using a unidirectional solidification crystal growth method and, in particular, to a vertical Bridgman-type single crystal growth apparatus.

BACKGROUND ART

A technique for growing a gallium oxide single crystal by the vertical Bridgman method is known (see, e.g., Patent Literature 1). In the vertical Bridgman method, in general, a crucible filled with a raw material is inserted into a crystal growth furnace having a vertical temperature gradient and is then pulled down, thereby growing a single crystal. Then, to control crystal orientation to obtain a high-quality crystal, it is necessary to perform a seeding process in which a portion of a seed crystal placed in the crucible is kept in a non-melted state and is brought into contact with a raw material melt.

To stably perform the seeding process, there must be a sufficient temperature difference between upper and lower portions of the seed crystal. When the temperature difference between the upper and lower portions of the seed crystal is not large enough, it leads to failure of the seeding process, such as melting the entire seed crystal or leaving the raw material partially not melted, which leads to a decrease in a yield of single crystal growth.

Usually, with use of a heater capable of heating to a temperature well above a melting point of a crystal to be grown, a sufficient temperature difference between the upper and lower portions of the seed crystals can be provided by increasing the vertical temperature gradient in the crystal growth furnace.

CITATION LIST

Patent Literature

Patent Literature 1: JP 2020/164415 A

SUMMARY OF INVENTION

However, in growing $\beta$—$Ga_2O_3$ single crystal, it is necessary to maintain an oxidizing atmosphere in the crystal growth furnace to prevent decomposition of the raw material melt at high temperature. For this reason, a molybdenum disilicide heating element, which is resistant to oxidation and capable of melting $Ga_2O_3$, is used as a heater.

The maximum operating temperature of the molybdenum disilicide heating element is about 1850° C. and is close to the melting point of $Ga_2O_3$ which is about 1795° C. Therefore, the vertical temperature gradient in the crystal growth furnace is inevitably small, making it difficult to provide a sufficient temperature difference between the upper and lower portions of the seed crystal.

In this regard, there is a method in which a sufficient temperature difference between the upper and lower portions of the seed crystal is provided by using a seed crystal which is longer than usual seed crystals. However, in this method, it is necessary to increase a length of a portion of the crucible accommodating the seed crystal. In growing $\beta$—$Ga_2O_3$ single crystal, a crucible formed of an expensive material such as Pt—Rh alloy is used. Therefore, increasing the length of the portion of the crucible accommodating the seed crystal significantly increases the manufacturing cost of the crucible.

It is an object of the invention to provide a single crystal growth apparatus which is capable of providing a sufficient temperature difference between upper and lower portions of a seed crystal in growing a $\beta$—$Ga_2O_3$ single crystal without using a particularly long seed crystal while using a unidirectional solidification crystal growth method such as the vertical Bridgeman method.

An aspect of the invention provides a single crystal growth apparatus defined in (1) to (4) below.

(1) A single crystal growth apparatus to grow a single crystal of a gallium oxide-based semiconductor, the single crystal growth apparatus comprising:

a crucible that comprises a seed crystal section to accommodate a seed crystal, and a growing crystal section which is located on the upper side of the seed crystal section and in which the single crystal is grown by crystallizing a raw material melt accommodated therein;

a tubular susceptor surrounding the seed crystal section and also supporting the crucible from below; and a molybdenum disilicide heating element to melt a raw material in the growing crystal section to obtain the raw material melt, wherein the susceptor comprises a thick portion at a portion in a height direction that is thicker and has a shorter horizontal distance from the seed crystal section than other portions, and wherein the thick portion surrounds at least a portion of the seed crystal section in the height direction.

(2) The single crystal growth apparatus defined in (1), wherein a value of a ratio of an inner diameter of the thick portion to an outer diameter of the seed crystal section is not more than 2.5.

(3) The single crystal growth apparatus defined in (1) or (2), wherein a lower end of the thick portion is located higher than a lower end of the seed crystal section.

(4) The single crystal growth apparatus defined in any one of (1) to (3), wherein a width of the thick portion in the height direction is not less than 16 mm.

(5) The single crystal growth apparatus according to any one of (1) to (4), wherein an upper end of the thick portion is located lower than an upper end of the seed crystal section.

Advantageous Effects of Invention

According to an embodiment of the invention, a single crystal growth apparatus can be provided which is capable of providing a sufficient temperature difference between upper and lower portions of a seed crystal in growing a $\beta$—$Ga_2O_3$ single crystal without using a particularly long seed crystal while using the unidirectional solidification crystal growth method such as the vertical Bridgeman method.

DESCRIPTION OF EMBODIMENTS

Embodiment (Configuration of a Single Crystal Growth Apparatus)

Figure 1:
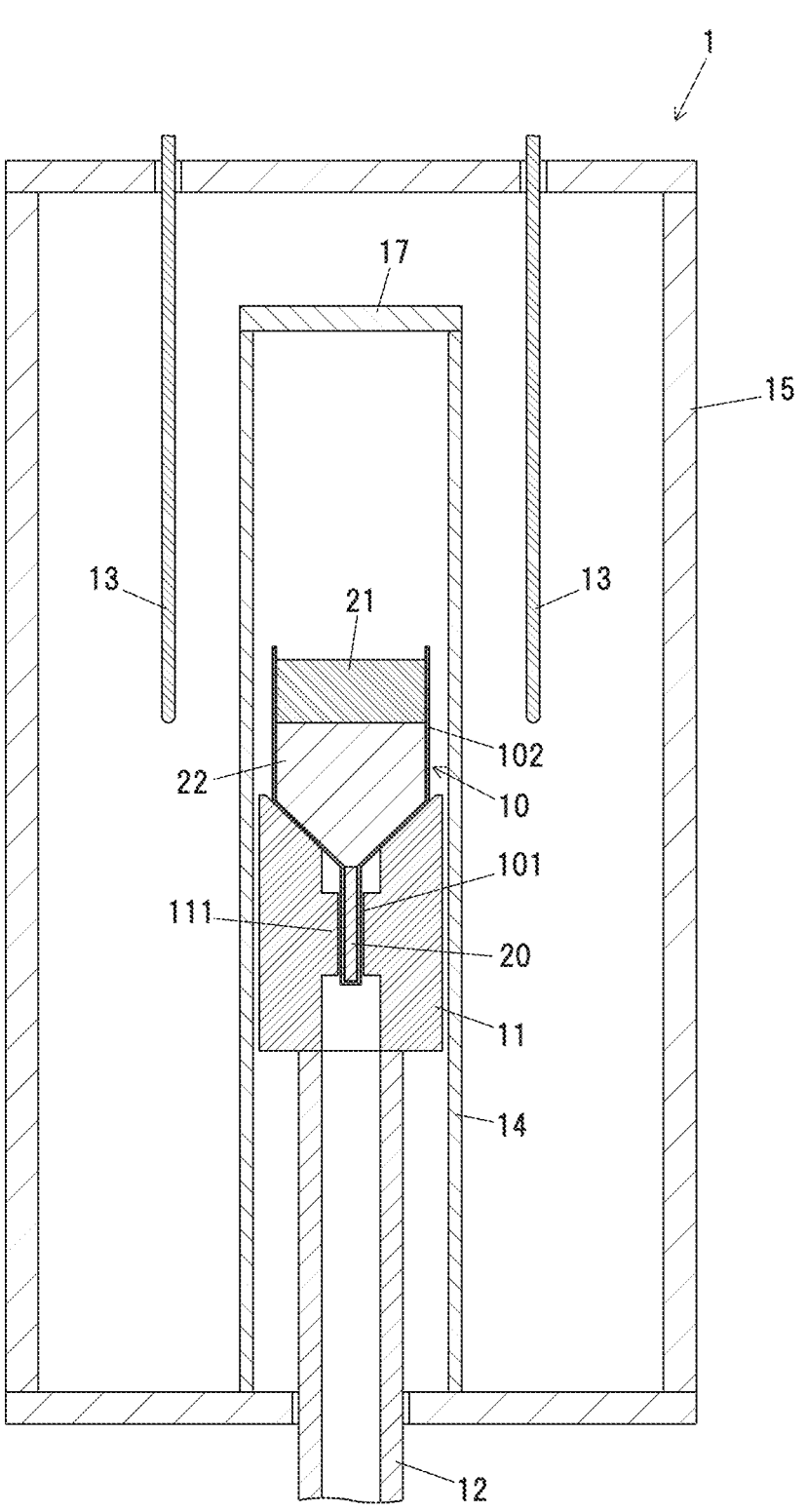
FIG. 1 is a schematic vertical cross-sectional view showing a configuration of a single crystal growth apparatus in an embodiment of the present invention.

FIG. 1 is a schematic vertical cross-sectional view showing a configuration of a single crystal growth apparatus 1 in an embodiment of the invention. The single crystal growth apparatus 1 is a vertical Bridgman-type single crystal growth apparatus (a vertical Bridgman furnace) and is capable of growing a single crystal of gallium oxide-based semiconductor. The gallium oxide-based semiconductor here refers to $\beta$—$Ga_2O_3$, or refers to $\beta$—$Ga_2O_3$ including a substitutional impurity such as Al, In, or a dopant such as Sn, Si.

The single crystal growth apparatus 1 includes a crucible 10, a susceptor 11 that supports the crucible 10 from below and is movable vertically, a tubular furnace core tube 14 that surrounds the crucible 10, the susceptor 11 and a crucible support shaft 12, a molybdenum disilicide heating element 13 placed outside the furnace core tube 14, and a housing 15 that is formed of a thermal insulating material and accommodates the components of the single crystal growth apparatus 1 described above.

The crucible 10 has a seed crystal section 101 to accommodate a seed crystal 20, and a growing crystal section 102 which is located on the upper side of the seed crystal section 101 and in which a single crystal 22 of gallium oxide-based semiconductor is grown by crystallizing a raw material melt 21 accommodated therein.

The growing crystal section 102 typically includes a constant diameter portion having a constant inner diameter larger than an inner diameter of the seed crystal section 101, and a diameter-increasing portion that is located between the constant diameter portion and the seed crystal section 101 and has an inner diameter increasing from the seed crystal section 101 side toward the constant diameter portion, as shown in FIG. 1.

The crucible 10 has a shape and size corresponding to a shape and size of the single crystal 22 to be grown. When growing, e.g., the single crystal 22 having a columnar-shaped constant diameter portion with a diameter of 2 inches, the crucible 10 provided with the growing crystal section 102 having a columnar-shaped constant diameter portion with an inner diameter of 2 inches is used. Meanwhile, when growing the single crystal 22 provided with the constant diameter portion having a shape other than the columnar shape, e.g., a quadrangular prism shape or a hexagonal prism shape, the crucible 10 provided with the growing crystal section 102 having a quadrangular prism-shaped or hexagonal prism-shaped growing crystal section 102 is used. A lid may be used to cover an opening of the crucible 10.

The crucible 10 is formed of a heat-resistant material which is capable of withstanding temperature of a gallium oxide-based semiconductor melt as the raw material melt 21 (temperature of not less than a melting point of the gallium oxide-based semiconductor) and is less likely to react with the gallium oxide-based semiconductor melt, and the crucible 10 is formed of, e.g., a Pt—Rh alloy.

The susceptor 11 is a tubular member that surrounds the seed crystal section 101 of the crucible 10 and also supports the crucible 10 from below. The susceptor 11 has a thick portion 111 at a portion in a height direction that is thicker than the other portions and has a shorter horizontal distance $D_t$ from the seed crystal section 101 (has a smaller inner diameter) than the other portions. The thick portion 111 surrounds (is located at the same height as) at least a portion of the seed crystal section 101 in the height direction.

Figure 2:
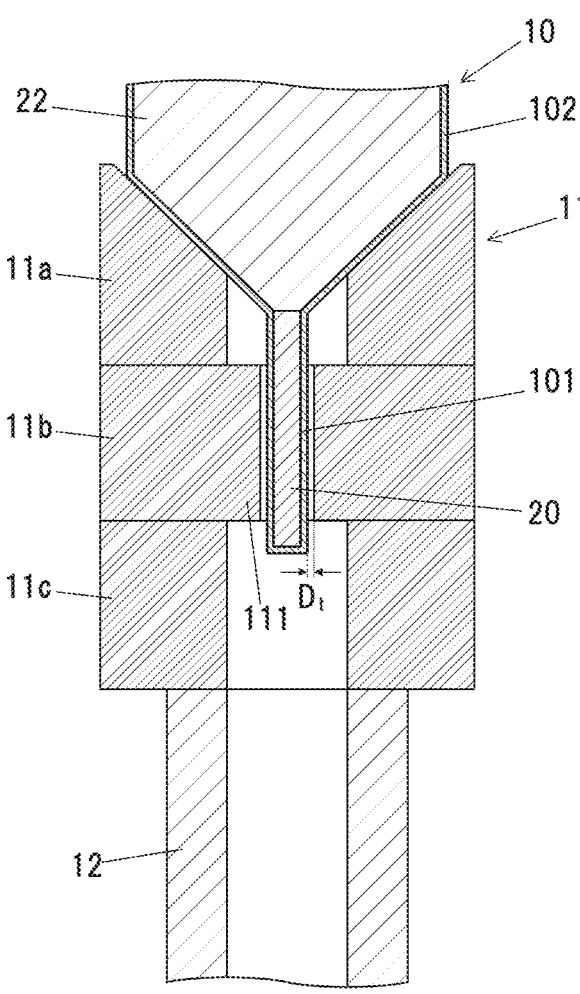
FIG. 2 is an enlarged cross-sectional view showing a portion around a susceptor in the single crystal growth apparatus.

FIG. 2 is an enlarged cross-sectional view showing a portion around the susceptor 11 in the single crystal growth apparatus 1. The susceptor 11 may be composed of plural blocks (blocks 11a to 11c in the example shown in FIG. 2) that are coupled vertically, as shown in FIG. 2. In this case, a block which is thicker and has a shorter horizontal distance $D_t$ from the seed crystal section 101 than the other blocks (the block 11b in the example shown in FIG. 2) can be provided as the thick portion 111.

The susceptor 11 is formed of a heat-resistant material capable of withstanding growth temperature of gallium oxide-based semiconductor single crystal and not reacting with the crucible 10 at the growth temperature, and the susceptor 11 is formed of, e.g., zirconia or alumina.

The crucible support shaft 12 is connected to the susceptor 11 on the lower side, and the susceptor 11 and the crucible 10 supported by the susceptor 11 can be moved vertically by vertically moving the crucible support shaft 12 using a drive mechanism (not shown). The crucible support shaft 12 may also be able to be rotated about the vertical direction by the above-mentioned drive mechanism. In this case, the crucible 10 supported by the susceptor 11 can be rotated inside the furnace core tube 14.

The crucible support shaft 12 is formed of a heat-resistant material capable of withstanding growth temperature of gallium oxide-based semiconductor single crystal, and is formed of, e.g., zirconia or alumina.

The crucible support shaft 12 is typically a tubular member, in the same manner as the susceptor 11. In this case, a thermocouple to measure temperature in the crucible 10 can be inserted inside the susceptor 11 and the crucible support shaft 12.

The molybdenum disilicide heating element 13 is a resistive heating element formed of molybdenum disilicide ($MoSi_2$), and is a heater to melt a raw material of gallium oxide-based semiconductor accommodated in the growing crystal section 102 to obtain the raw material melt 21.

The molybdenum disilicide heating element 13 is inserted into the housing 15 from a hole provided on the housing 15 and is connected, outside of the housing 15, to an external device (not shown) to supply a current to the molybdenum disilicide heating element 13.

The furnace core tube 14 is used to regulate heat flow around the crucible 10 or to suppress contamination with impurities such as Si, Mo from the molybdenum disilicide heating element 13. The furnace core tube 14 typically has a circular tube shape. The furnace core tube 14 may alternatively be composed of plural stacked annular members.

In addition, a lid 17 may be placed on an upper opening of the furnace core tube 14, as shown in FIG. 1. Upward escape of heat around the crucible 10 can be suppressed by using the lid 17.

The furnace core tube 14 and the lid 17 are formed of a heat-resistant material capable of withstanding growth temperature of gallium oxide-based semiconductor single crystal, and are formed of, e.g., zirconia or alumina.

(Configuration to Provide a Temperature Difference Between Upper and Lower Portions of the Seed Crystal)

As described above, the maximum operating temperature of the molybdenum disilicide heating element 13 is about 1850° C. and is close to the melting point of $Ga_2O_3$ which is about 1795° C. Therefore, the vertical temperature gradient in the single crystal growth apparatus 1 is inevitably small and it is difficult to provide a sufficient temperature difference between the upper and lower portions of the seed crystal 20 by controlling the temperature of the molybdenum disilicide heating element 13. Therefore, in the single crystal growth apparatus 1, the temperature difference between the upper and lower portions of the seed crystal 20 is increased by providing the thick portion 111 on the susceptor 11.

Since the thick portion 111 is thicker than the other portions and has a shorter horizontal distance $D_t$ from the seed crystal section 101 than the other portions, heat from the surroundings is less likely to be transferred to a portion of the seed crystal section 101 surrounded by the thick portion 111, hence, temperature rise is suppressed. In addition, the thick portion 111 intercepts the radiant heat transferred from top to bottom on the outer side of the crucible 10, thereby suppressing the temperature rise of a portion of the seed crystal section 101 surrounded by the thick portion 111 and of a portion thereunder.

To further increase the temperature difference between the upper and lower portions of the seed crystal 20, it is preferable that a value of a ratio of an inner diameter of the thick portion 111 to an outer diameter of the seed crystal section 101 be not more than 2.5.

In addition, to further increase the temperature difference between the upper and lower portions of the seed crystal 20, it is preferable that a lower end of the thick portion 111 be located higher than a lower end of the seed crystal section 101.

In addition, to further increase the temperature difference between the upper and lower portions of the seed crystal 20, it is preferable that a width of the thick portion 111 in the height direction be not less than 16 mm.

In addition, to further increase the temperature difference between the upper and lower portions of the seed crystal 20, it is preferable that an upper end of the seed crystal section 101 be not surrounded by the thick portion 111 and a portion below the upper end be surrounded by the thick portion 111, i.e., an upper end of the thick portion 111 be located lower than the upper end of the seed crystal section 101.

(Methods for Growing a Single Crystal)

Firstly, the seed crystal 20 of gallium oxide-based semiconductor is placed in the seed crystal section 101 of the crucible 10, and a raw material of gallium oxide-based semiconductor, such as sintered $\beta$—$Ga_2O_3$, is placed in the growing crystal section 102.

Next, the inside the single crystal growth apparatus 1 (the inner side of the housing 15) is heated by the molybdenum disilicide heating element 13 so as to form such a temperature gradient that temperature on the upper side is higher and temperature on the lower side is lower, thereby melting the raw material of gallium oxide in the crucible 10 and obtaining the raw material melt 21.

In a typical method, firstly, the height of the crucible 10 is adjusted by vertically moving the crucible support shaft 12 so that temperature in an upper region in the growing crystal section 102 is increased to not less than the melting point of gallium oxide. An upper portion of the raw material inside the growing crystal section 102 is thereby melted. Next, the raw material is melted to the bottom while raising the crucible 10 at a predetermined speed by moving the crucible support shaft 12 upward at a predetermined speed, thereby eventually melting the entire raw material and a portion of the seed crystal.

Next, the raw material melt 21 is crystallized from the lower side (the seed crystal 20 side) while lowering the crucible 10 at a predetermined speed by moving the crucible support shaft 12 downward, thereby growing the single crystal 22. After the entire raw material melt 21 is crystallized, the crucible 10 is removed and the single crystal 22 is taken out.

Effects of the Embodiment

In the single crystal growth apparatus 1 in the embodiment of the invention, the temperature difference between the upper and lower portions of the seed crystal 20 is increased by providing the thick portion 111 on the susceptor 11. Therefore, a high-quality single crystal 22 of gallium oxide-based semiconductor which has a melting point close to the maximum operating temperature of the heating element can be grown by the vertical Bridgeman method.

In addition, the method in which the thick portion 111 is provided on the susceptor 11 can increase the temperature difference between the upper and lower portions of the seed crystal 20 with substantially no increase in the device manufacturing cost unlike the method using a particularly long seed crystal.

In the meantime, the larger the diameter of the single crystal 22 to be grown, the greater the amount of heat required to melt the raw material and the greater the amount of heat transferred to the seed crystal 20, hence, the temperature difference between the upper and lower portions of the seed crystal is likely to be small. For this reason, in general, it is difficult to grow a large-diameter single crystal of gallium oxide-based semiconductor by the vertical Bridgeman method. However, in the embodiment of the invention, it is possible to obtain, e.g., a gallium oxide-based semiconductor single crystal (ingot) having a columnar-shaped constant diameter portion with a diameter of 2 to 8 inches, and wafers with a diameter of 2 to 8 inches can be cut out from it.

EXAMPLES

A demonstration experiment was conducted to investigate the effect of providing the thick portion 111 on the susceptor 11 in the single crystal growth apparatus 1. Next, the details of the demonstration experiment and its results will be described.

Figure 3:
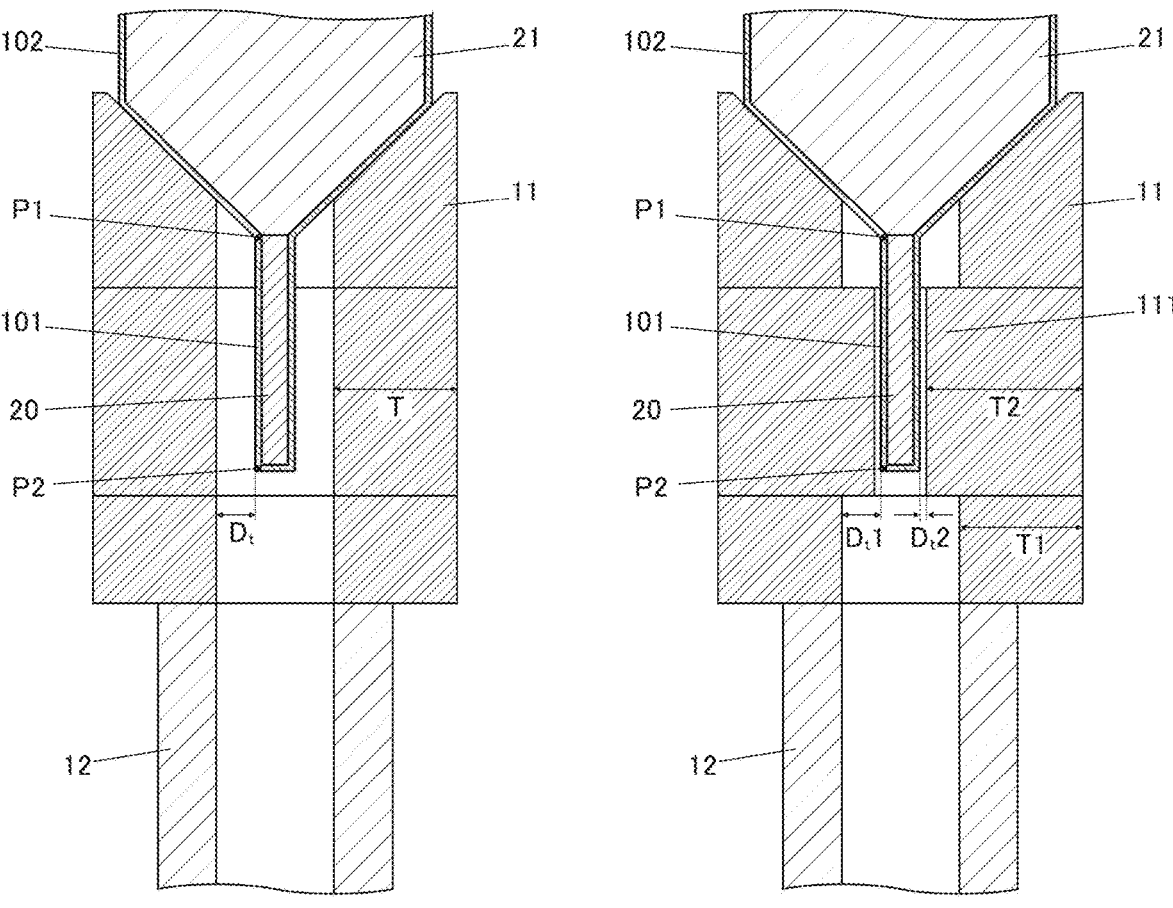
FIGS. 3A and 3B are vertical cross-sectional views showing configurations of two types of susceptors used in demonstration experiment in Example 1.

FIGS. 3A and 3B are vertical cross-sectional views showing configurations of two types of susceptors 11 used in the demonstration experiment in Example 1. The susceptor 11 shown in FIG. 3A (hereinafter, referred to as Sample A), which does not include the thick portion 111, has a constant thickness. On the other hand, the susceptor 11 shown in FIG. 3B (hereinafter, referred to as Sample B) includes the thick portion 111 at a position surrounding a portion of the seed crystal section 101. In this regard, the susceptor 11 and the seed crystal section 101 in both Samples A and B have an annular shape in a horizontal cross section.

Here, a thickness T of Sample A is 20 mm and the horizontal distance $D_t$ between Sample A and the seed crystal section 101 is 7.2 mm Meanwhile, a thickness T1 of a portion of Sample B other than the thick portion 111 is 20 mm, a thickness T2 of the thick portion 111 is 26 mm, a horizontal distance DJ between the portion of Sample B other than the thick portion 111 and the seed crystal section 101 is 7.2 mm, and a horizontal distance $D_t2$ between the thick portion 111 and the seed crystal section 101 is 1.2 mm.

Figure 4:
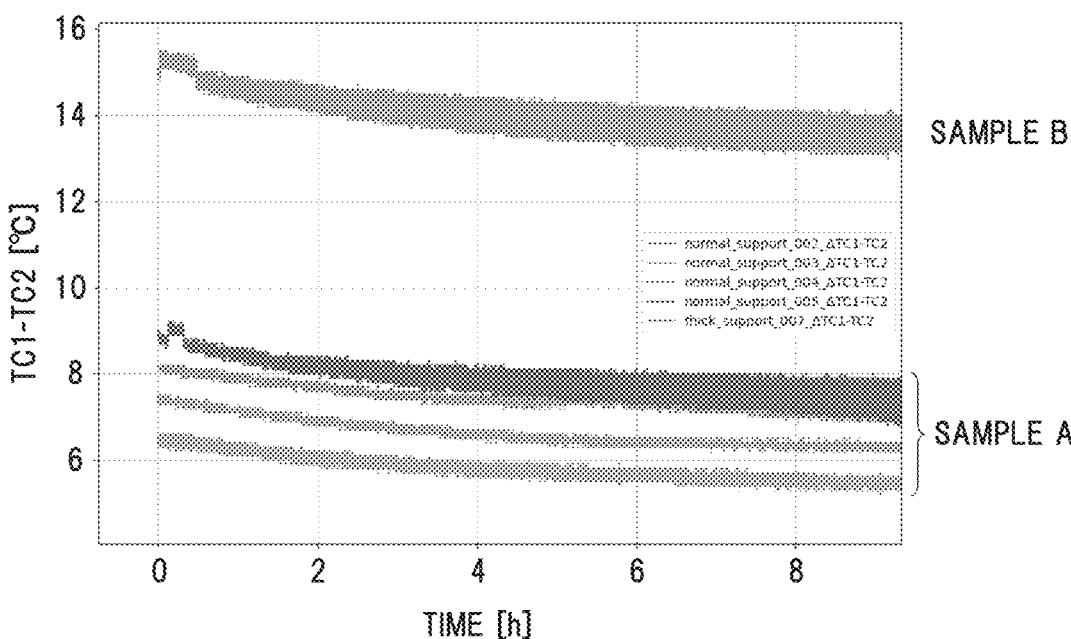
FIG. 4 is a graph showing measurement results of temperature difference between upper and lower portions of seed crystal sections of Samples A and B in Example 1.

FIG. 4 is a graph showing measurement results of temperature difference between upper and lower portions of the seed crystal sections 101 of Samples A and B. The vertical axis in FIG. 4 indicates TC1-TC2 [° C.] which is a difference between a temperature TC1 of a measurement point P1 at the top of the seed crystal section 101 and a temperature TC2 of a measurement point P2 at the bottom of the seed crystal section 101. The horizontal axis indicates elapsed time [h] where the reference time is 0. The reference time here is the time at which the height of the crucible 10 and output of the molybdenum disilicide heating element 13 reach the same predetermined values in each measurement. Sample A includes measurement results 002-005 of FIG. 4 and sample B includes measurement results 007 of FIG. 4.

According to the results shown in FIG. 4, TC1-TC2 of Sample A at the reference time was 6 to 9° C., while TC1-TC2 of Sample B was about 15° C. These results confirmed that providing the thick portion 111 on the susceptor 11 is effective to increase the temperature difference between the upper and lower portions of the seed crystal sections 101.

Example 2

A relationship between the shape of the susceptor 11 and the temperature difference between the upper and lower portions of the seed crystal sections 101 in the single crystal growth apparatus 1 was investigated by simulation. Next, the details of the simulation and its results will be described.

Figure 5:
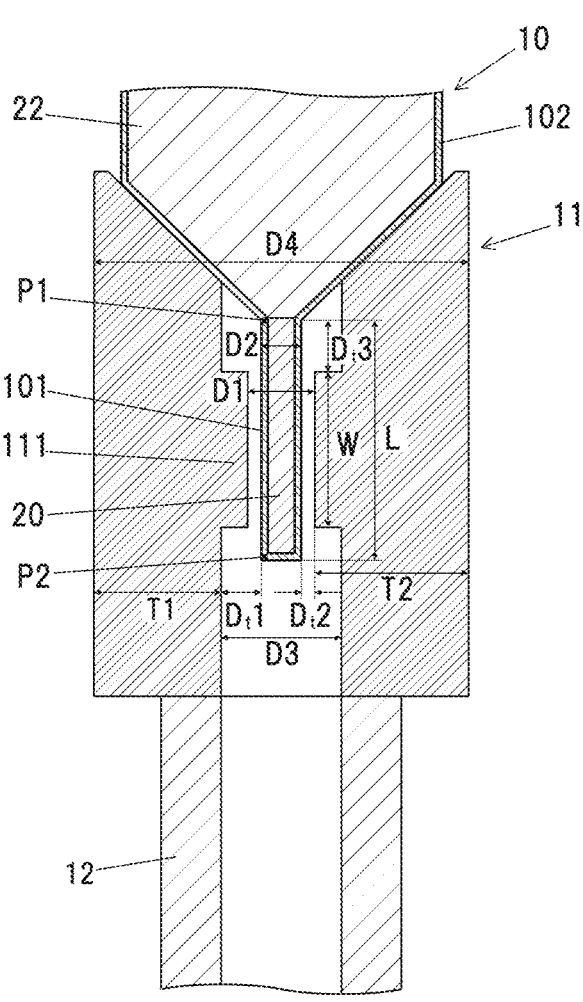
FIG. 5 is a vertical cross-sectional view showing a configuration of a model used in a simulation in Example 2.

FIG. 5 is a vertical cross-sectional view showing a configuration of a model used in the simulation in Example 2. Regarding TC1-TC2 which is a difference between the temperature TC1 of the measurement point P1 at the top of the seed crystal section 101 and the temperature TC2 of the measurement point P2 at the bottom of the seed crystal section 101, change in TC1-TC2 when changing parameters related to the shape of the susceptor 11 of the model shown in FIG. 5 was simulated.

Firstly, change in TC1-TC2 when changing an inner diameter D1 of the thick portion 111 of the susceptor 11 was investigated. In this simulation, the model shown in FIG. 5 was configured as follows: an outer diameter D2 of the seed crystal section 101 was 5.4 mm, an inner diameter D3 of a portion of the susceptor 11 other than the thick portion 111 was 20 mm, the thickness T1 of the portion of the susceptor 11 other than the thick portion 111 was 20 mm, a length L of the seed crystal section 101 was 40 mm, a distance $D_t3$ in the height direction between the upper end of the seed crystal section 101 and the thick portion 111 was 8 mm, and a width W of the thick portion 111 in the height direction was 5 mm.

Figure 6:
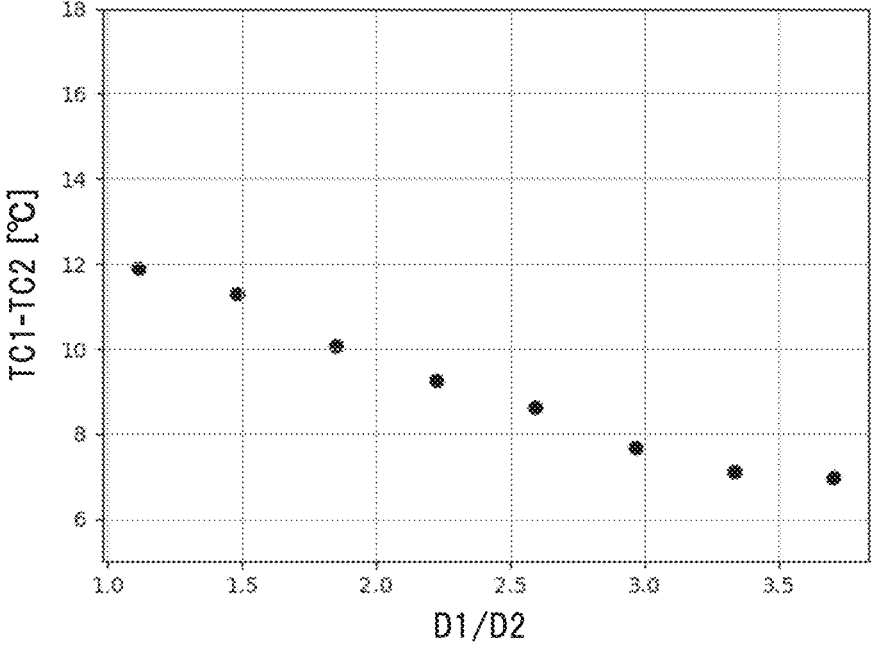
FIG. 6 is a graph showing a relationship between TC1-TC2 and a value of D1/D2 which is a ratio of an inner diameter D1 of a thick portion to an outer diameter D2 of the seed crystal section in Example 2.

FIG. 6 is a graph showing a relationship between TC1-TC2 and a value of D1/D2 which is a ratio of the inner diameter D1 of the thick portion 111 to the outer diameter D2 of the seed crystal section 101. According to the results shown in FIG. 6, TC1-TC2 increases as D1/D2 becomes closer to 1.

Based on the fact that temperature of a solid-liquid interface in the seeding process fluctuates within a range of about ±2° C. and temperature inside the single crystal growth apparatus 1 also fluctuates within a range of about ±2° C. even in the state in which the interface temperature is maintained, TC1-TC2 is preferably not less than 8° C. Therefore, from the results shown in FIG. 6, D1/D2 is preferably not more than 2.5. Table 1 below shows the numerical values of the plotted points on the graph in FIG. 6.

TABLE 1

| D1/D2 | TC1 – TC2 [° C.] |
|---|---|
| 1.1 | 11.9 |
| 1.5 | 11.3 |
| 1.9 | 10.1 |
| 2.2 | 9.2 |
| 2.6 | 8.6 |
| 3.0 | 7.7 |
| 3.3 | 7.1 |
| 3.7 | 7.0 |

Next, change in TC1-TC2 when changing the width W of the thick portion 111 of the susceptor 11 in the height direction was investigated. In this simulation, the model shown in FIG. 5 was configured as follows: the outer diameter D2 of the seed crystal section 101 was 5.4 mm, the inner diameter D1 of the thick portion 111 was 8 mm, the inner diameter D3 of the portion of the susceptor 11 other than the thick portion 111 was 20 mm, the thickness T1 of the portion of the susceptor 11 other than the thick portion 111 was 20 mm, the length L of the seed crystal section 101 was 40 mm, and the distance $D_t3$ in the height direction between the upper end of the seed crystal section 101 and the thick portion 111 was 5 mm.

Figure 7:
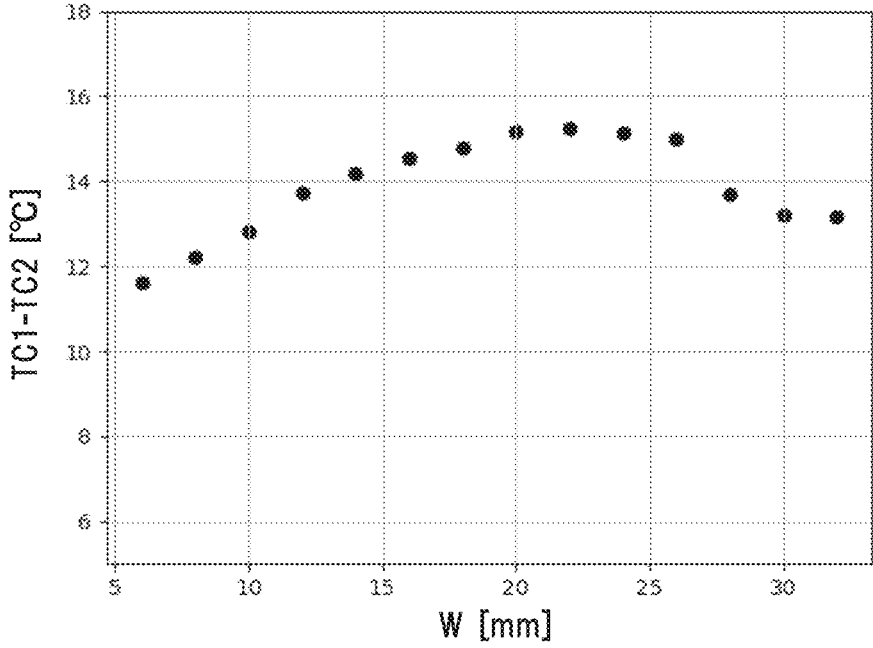
FIG. 7 is a graph showing a relationship between a width W of the thick portion in a height direction and TC1-TC2 in Example 2.

FIG. 7 is a graph showing a relationship between the width W of the thick portion 111 in the height direction and TC1-TC2. According to the results shown in FIG. 7, TC1-TC2 increases as the width W increases and the position of the lower end of the thick portion 111 in the height direction comes closer to the position of the lower end of the seed crystal section 101 in the height direction. And then, when the width W further increases and the position of the lower end of the thick portion 111 in the height direction becomes lower than the position of the lower end of the seed crystal section 101 in the height direction, TC1-TC2 decreases by about 2° C.

It is considered that the reason why TC1-TC2 decreases when the position of the lower end of the thick portion 111 in the height direction becomes lower than the position of the lower end of the seed crystal section 101 in the height direction is because radiant heat from the seed crystal section 101 is less likely to escape downward when the thick portion 111 surrounds the lower end of the seed crystal section 101. Therefore, the width W of the thick portion 111 in the height direction is preferably as large as possible within a range where the thick portion 111 does not surround the lower end of the seed crystal section 101.

From the results shown in FIG. 7, the lower end of the thick portion 111 is preferably located higher than the lower end of the seed crystal section 101, and the width W of the thick portion 111 in the height direction is preferably, e.g., not less than 16 mm Table 2 below shows the numerical values of the plotted points on the graph in FIG. 7.

TABLE 2

| Width W [mm] | TC1 − TC2 [° C.] |
|---|---|
| 6.0 | 11.6 |
| 8.0 | 12.2 |
| 10.0 | 12.8 |
| 12.0 | 13.7 |
| 14.0 | 14.2 |
| 16.0 | 14.6 |
| 18.0 | 14.8 |
| 20.0 | 15.2 |
| 22.0 | 15.2 |
| 24.0 | 15.2 |
| 26.0 | 15.0 |
| 28.0 | 13.7 |
| 30.0 | 13.2 |
| 32.0 | 13.2 |

Next, change in TC1-TC2, when the susceptor 11 does not have the thick portion 111 and the thickness T1 of the susceptor 11 is changed, was investigated. The thickness T1 was changed by changing an outer diameter D4 of the susceptor 11 while fixing the inner diameter D3. In this simulation, the model shown in FIG. 5 was configured as follows: the outer diameter D2 of the seed crystal section 101 was 5.4 mm, the inner diameter D3 of the susceptor 11 was 20 mm, and the length L of the seed crystal section 101 was 40 mm.

Figure 8:
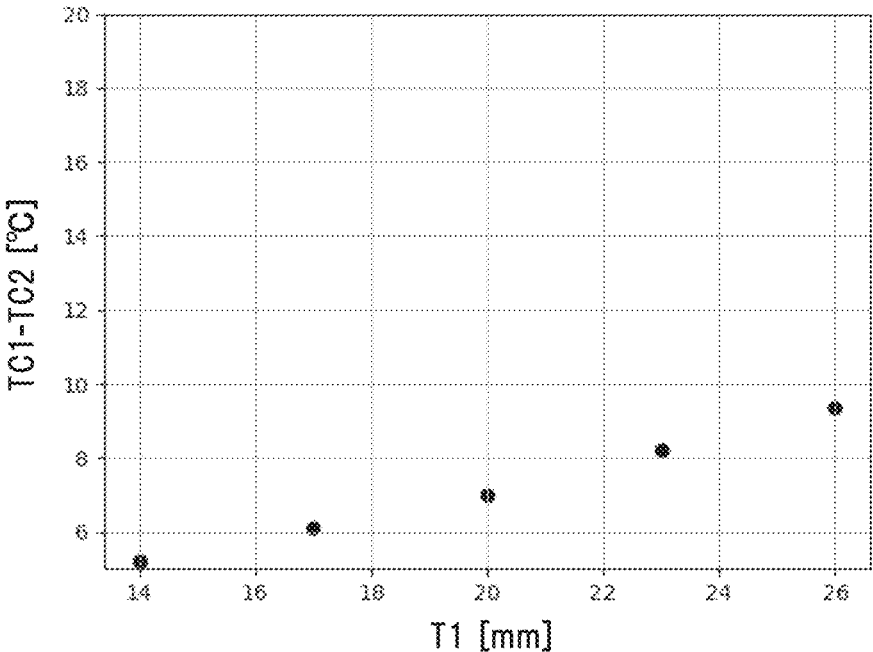
FIG. 8 is a graph showing a relationship between a thickness T1 of the susceptor not provided with a thick portion 111 and TC1-TC2 in Example 2.

FIG. 8 is a graph showing a relationship between the thickness T1 of the susceptor 11 not provided with the thick portion 111 and TC1-TC2. According to the results shown in FIG. 8, TC1-TC2 increases as the thickness T1 increases.

Next, change in TC1-TC2, when the susceptor 11 has the thick portion 111 and the thickness T1 of the portion of the susceptor 11 other than the thick portion 111 is changed, was investigated. The thickness T1 was changed by changing the outer diameter D4 of the susceptor 11 while fixing the inner diameter D3. In this regard, since the outer diameter D4 of the susceptor 11 is the same at the thick portion 111 and at the portion other than the thick portion 111 and each of the inner diameters D1 and D3 is constant, the thickness of the thick portion 111 excluding the thickness of the inwardly-protruding portion is the same as the thickness T1 of the portion other than the thick portion 111. In this simulation, the model shown in FIG. 5 was configured as follows: the outer diameter D2 of the seed crystal section 101 was 8 mm, the inner diameter D3 of the portion of the susceptor 11 other than the thick portion 111 was 20 mm, the length L of the seed crystal section 101 was 40 mm, the distance D₅3 in the height direction between the upper end of the seed crystal section 101 and the thick portion 111 was 8 mm, and the width W of the thick portion 111 in the height direction was 21 mm.

Figure 9:
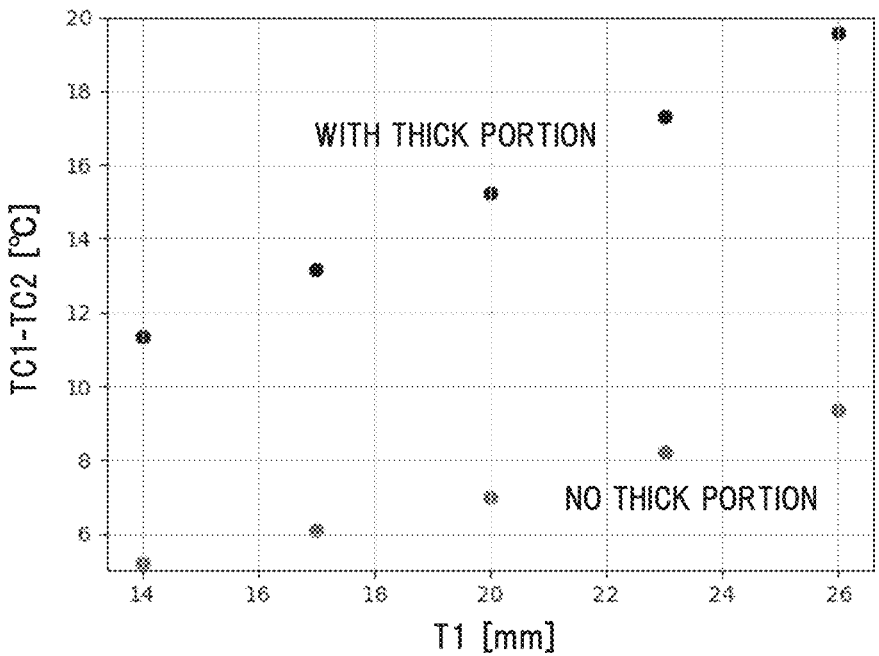
FIG. 9 is a graph showing a relationship between the thickness T1 of the susceptor provided with the thick portion 111 and TC1-TC2 in Example 2.

FIG. 9 is a graph showing a relationship between the thickness T1 of the portion of the susceptor 11 other than the thick portion 111 and TC1-TC2 in case that the susceptor 11 is not provided with the thick portion 111. In FIG. 9, the data shown in FIG. 8, which is the case where the thick portion 111 is not provided on the susceptor 11, is also shown as Comparative Example.

According to the results shown in FIG. 9, TC1-TC2 increases as the thickness T1 of the portion of the susceptor 11 other than the thick portion 111 (the thickness of the thick portion 111 excluding the thickness of the protruding portion) increases, and its degree (the slope of the straight line in the graph) is greater than when the thick portion 111 is not provided on the susceptor 11.

TC1-TC2 in the seeding process can range up to 7° C. depending on deterioration of the surrounding thermal insulating material or heater, even if the susceptors having the same structure are used. Therefore, TC1-TC2 is preferably not less than 8° C. as described above, but is more preferably not less than 15° C. to stably perform the seeding without being affected by deterioration of the surrounding members. Therefore, from the results shown in FIG. 9, the thickness T1 of the portion of the susceptor 11 other than the thick portion 111 (the thickness of the thick portion 111 excluding the thickness of the protruding portion) is preferably not less than 20 mm Table 3 below shows the numerical values of the plotted points on the graph in FIG. 9.

TABLE 3

| T1 [mm] | TC1 − TC2 [° C.] | |
|---|---|---|
| | No Thick portion | With Thick portion |
| 14 | 5.2 | 11.3 |
| 17 | 6.1 | 13.2 |
| 20 | 7.0 | 15.2 |
| 23 | 8.2 | 17.3 |
| 26 | 9.3 | 19.6 |

Although the embodiment and Examples of the invention have been described, the invention is not limited to the embodiment and Examples, and the various kinds of modifications can be implemented without departing from the gist of the invention. For example, although the vertical Bridgman-type single crystal growth apparatus has been described in the embodiment, the invention can be applied to a single crystal growth apparatus using another unidirectional solidification crystal growth method and including a crucible, a susceptor and a heating element, etc., similar to those of the vertical Bridgman-type single crystal growth apparatus described above, e.g., a single crystal growth apparatus using the vertical gradient freeze method. The vertical gradient freeze method is different from the vertical Bridgman method in that temperature distribution inside an apparatus (a furnace) is varied instead of moving the crucible, but it possible to use a crucible, a susceptor and a heating element, etc., similar to those of the vertical Bridgman-type single crystal growth apparatus described above. In addition, the constituent elements in the embodiment and Examples described above can be arbitrarily combined without departing from the gist of the invention.

In addition, the embodiment and Examples described above do not limit the invention according to claims. Further, please note that not all combinations of the features described in the embodiment and Examples are necessary to solve the problem of the invention.

REFERENCE SIGNS LIST

1 SINGLE CRYSTAL GROWTH APPARATUS
10 CRUCIBLE
101 SEED CRYSTAL SECTION
102 GROWING CRYSTAL SECTION
11 SUSCEPTOR

11

111 THICK PORTION
13 MOLYBDENUM DISILICIDE HEATING ELEMENT
20 SEED CRYSTAL
21 RAW MATERIAL MELT
22 SINGLE CRYSTAL

The invention claimed is:

1. A single crystal growth apparatus to grow a single crystal of a gallium oxide-based semiconductor, the single crystal growth apparatus comprising:

a crucible that comprises a seed crystal section to accommodate a seed crystal, and a growing crystal section which is located on an upper side of the seed crystal section and in which the single crystal is grown by crystallizing a raw material melt accommodated therein;

a tubular susceptor surrounding the seed crystal section and also supporting the crucible from below; and a molybdenum disilicide heating element to melt a raw material in the growing crystal section to obtain the raw material melt, wherein the susceptor comprises a thick portion at a portion in a height direction that is thicker and has a shorter horizontal distance from the seed crystal section than an other portion, and

wherein the thick portion surrounds at least a portion of the seed crystal section in the height direction, wherein an upper end of the thick portion in the height direction of the susceptor is located lower than an upper end of the seed crystal section in the height direction of the susceptor during growth of the single crystal in the growing crystal section, wherein the seed crystal section is connected to the growing crystal section, wherein the thick portion protrudes from the other portion in a horizontal direction of the susceptor such that a surface of the upper end of the thick portion is exposed.

2. The single crystal growth apparatus according to claim 1, wherein a value of a ratio of an inner diameter of the thick portion to an outer diameter of the seed crystal section is not more than 2.5.

3. The single crystal growth apparatus according to claim 1, wherein a lower end of the thick portion is located higher than a lower end of the seed crystal section.

4. The single crystal growth apparatus according to claim 1, wherein a width of the thick portion in the height direction is not less than 16 mm.

* * * * *